United States Patent
Tsorng et al.

(10) Patent No.: US 12,312,833 B2
(45) Date of Patent: May 27, 2025

(54) LOCKING SYSTEMS FOR SERVER CABINETS

(71) Applicant: Quanta Computer Inc., Taoyuan (TW)

(72) Inventors: Yaw-Tzorng Tsorng, Taoyuan (TW); Hsi-Chi Chien, Taoyuan (TW); Jen-Jia Liou, Taoyuan (TW); Keng-Yi Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 516 days.

(21) Appl. No.: 17/695,508

(22) Filed: Mar. 15, 2022

(65) Prior Publication Data

US 2023/0203837 A1 Jun. 29, 2023

Related U.S. Application Data

(60) Provisional application No. 63/265,985, filed on Dec. 23, 2021.

(51) Int. Cl.
*E05B 1/00* (2006.01)
*H05K 7/14* (2006.01)

(52) U.S. Cl.
CPC ......... *E05B 1/0053* (2013.01); *H05K 7/1427* (2013.01)

(58) Field of Classification Search
CPC .. H05K 7/1402; H05K 7/1404; H05K 7/1405; H05K 7/1408
See application file for complete search history.

(56) References Cited

U.S. PATENT DOCUMENTS

| 9,229,495 | B2* | 1/2016 | Kuo | G06F 1/188 |
| 2007/0221393 | A1* | 9/2007 | Adducci | H04Q 1/066 174/50 |
| 2020/0329579 | A1* | 10/2020 | Triplett | G06F 1/187 |

* cited by examiner

*Primary Examiner* — Kristina R Fulton
*Assistant Examiner* — Thomas L Neubauer
(74) *Attorney, Agent, or Firm* — NIXON PEABODY LLP

(57) ABSTRACT

Embodiments of the disclosure are directed to a cabinet for storing server equipment. The cabinet includes a fan cover disposed over the cabinet and configured to secure a plurality of fan units, and a locking system for securing the fan cover. The fan cover has a channel disposed along a front edge of the fan cover. The locking system includes at least one T-bar and a bracket. The at least one T-bar includes a horizontal bar movably disposed within the channel, and a vertical bar extending generally perpendicularly to the horizontal bar from a first end of the vertical bar. The bracket is coupled to a second end of the vertical bar. The bracket has a knob attached thereto for locking and unlocking the horizontal bar at a first position that locks the fan cover and a second position that unlocks the fan cover.

20 Claims, 10 Drawing Sheets

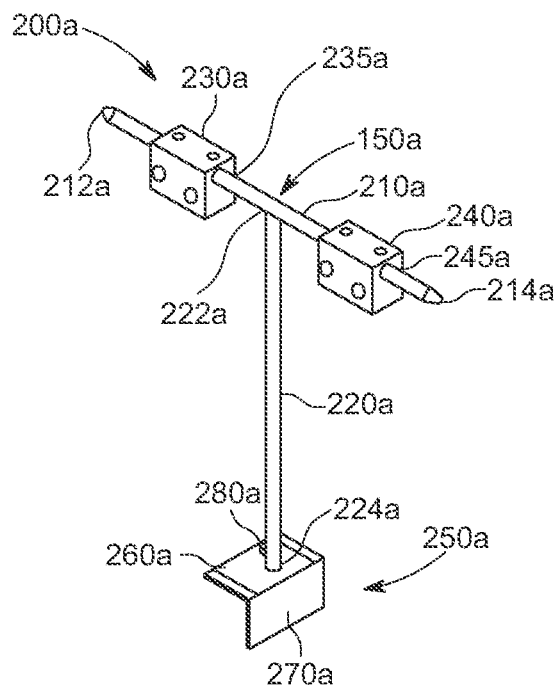
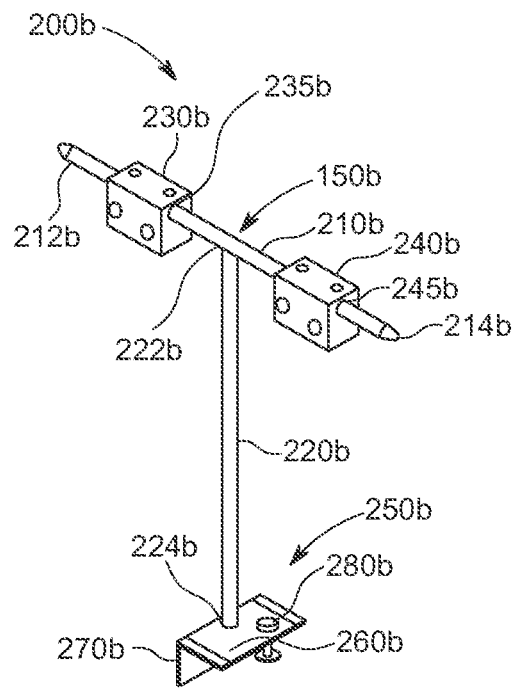
FIG. 2A
FIG. 2C
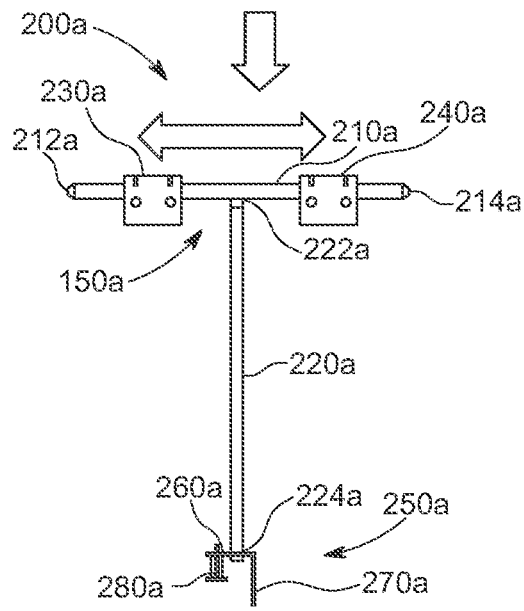
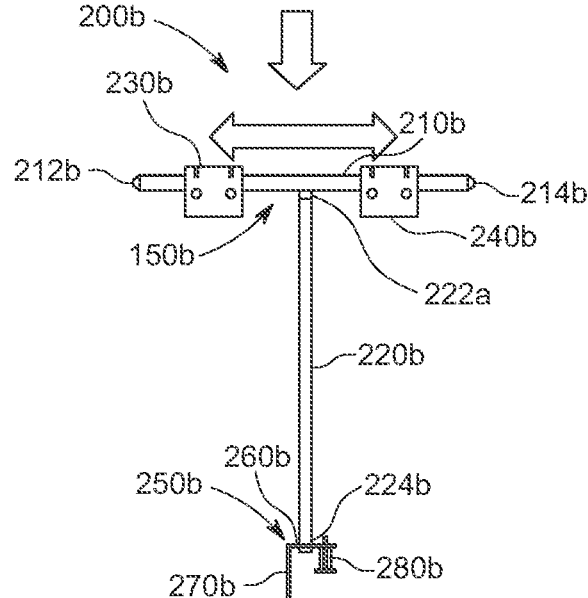
FIG. 2B
FIG. 2D

LOCKING SYSTEMS FOR SERVER CABINETS

CROSS-REFERENCE TO RELATED APPLICATIONS

This application claims priority from and benefit of U.S. Provisional Application No. 63/265,985, entitled "Design Of The Built In Lock For The Outdoor Cabinet," and filed on Dec. 23, 2021. The contents of that application are hereby incorporated by reference in their entirety.

FIELD OF THE INVENTION

The present invention relates generally to storage of information-handling systems, and more specifically, to a locking system used in a cabinet for storing information-handling systems like servers.

BACKGROUND OF THE INVENTION

A server is a specialized computer system that provides various critical functionalities, such as sharing data, resources, and performing computation of data for multiple client devices located in remote locations. It is important to secure server cabinets to prevent theft and damage to the servers or fan units stored therein. While separate locking systems may be used for securing the servers and the fan units within the server units, it would be desirable to have a simpler locking system that involves use of a single key lock to secure both the servers and the fan units.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cabinet for storing server equipment is disclosed. The cabinet includes a fan cover disposed over the cabinet and configured to secure a plurality of fan units, and a locking system for securing the fan cover. The fan cover has a channel disposed along a front edge of the fan cover. The locking system includes at least one T-bar and a bracket. The at least one T-bar includes a horizontal bar movably disposed within the channel, and a vertical bar extending generally perpendicularly to the horizontal bar from a first end of the vertical bar. The bracket is coupled to a second end of the vertical bar. The bracket has a knob attached thereto for locking and unlocking the horizontal bar at a first position that locks the fan cover and a second position that unlocks the fan cover.

According to certain aspects of the present disclosure, the at least one T-bar further includes at least one block fixed to the channel. The at least one block has a through-hole for accommodating the horizontal bar therethrough.

According to certain aspects of the present disclosure, the at least one T-bar further includes two blocks, wherein each block is disposed on either side of the first end of the vertical bar.

According to certain aspects of the present disclosure, the bracket includes (i) a horizontal plate coupled to the knob and the second end of the vertical bar, and (ii) a vertical plate extending generally perpendicular to the horizontal plate for moving the horizontal bar between the first position and the second position.

According to certain aspects of the present disclosure, the cabinet further includes a front door having a key lock that provides access to the server equipment.

According to certain aspects of the present disclosure, the bracket is accessible after opening the front door.

According to certain aspects of the present disclosure, the knob is configured to be pulled downwards for unlocking the horizontal bar at each of the first position and the second position.

According to certain aspects of the present disclosure, the locking system further includes a first T-bar and a second T-bar. The first T-bar is configured to move between a left edge of the channel on the fan cover and a central portion of the channel. The second T-bar is configured to move between a right edge of the channel on the fan cover and the central portion of the channel.

According to certain aspects of the present disclosure, the first position that locks the fan cover is formed by the first T-bar positioned at the left edge of the channel and the second T-bar positioned at the right edge of the channel, and the second position that unlocks the fan cover is formed by both the first T-bar and the second T-bar positioned at the central portion of the channel.

According to certain aspects of the present disclosure, a cabinet for storing server equipment. The cabinet includes a fan cover disposed over the cabinet and configured to secure a plurality of fan units, and a locking system for securing the fan cover. The fan cover has a channel disposed along a front edge of the fan cover. The locking system includes at least one T-bar. The at least one T-bar includes a horizontal bar movably disposed within the channel, a vertical bar extending generally perpendicularly to the horizontal bar from a first end of the vertical bar, and two blocks fixed to the channel. Each block is disposed on either side of the first end of the vertical bar and has a through-hole for accommodating the horizontal bar therethrough.

According to certain aspects of the present disclosure, the cabinet further includes a bracket coupled to a second end of the vertical bar. The bracket has a knob attached thereto for locking and unlocking the horizontal bar between a first position that locks the fan cover and a second position that unlocks the fan cover.

According to certain aspects of the present disclosure, a method for securing a fan cover disposed over a server cabinet is disclosed. The method includes providing a front door of a server cabinet, wherein the front door has an open and a closed position. The method further includes configuring a locking system for access to a knob, where the knob is attached to a bracket of the locking system. The locking system further includes at least one T-bar having a horizontal bar movably disposed within a channel along a front edge of the fan cover, and a vertical bar to which the horizontal bar and the bracket are coupled. The method further includes making the knob movable such that (i) pulling the knob downwards unlocks the horizontal bar from a first position that locks the fan cover, and (ii) pushing the bracket sideways moves the horizontal bar from the first position to a second position that unlocks the fan cover.

According to certain aspects of the present disclosure, the method further includes configuring the knob to be secured when the horizontal bar is at the second position.

According to certain aspects of the present disclosure, the method further includes configuring a first T-bar to move between a left edge of the channel and a central portion of the channel such that a corresponding bracket on the first T-bar is pushed rightward, and configuring a second T-bar to move between a right edge of the channel and the central portion of the channel such that a corresponding bracket on the second T-bar is pushed leftward.

According to certain aspects of the present disclosure, the method further includes forming the first position that locks the fan cover via the first T-bar being positioned at the left edge of the channel and the second T-bar being positioned at the right edge of the channel, and forming the second position that unlocks the fan cover via both the first T-bar and the second T-bar being positioned at the central portion of the channel.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 2A shows a front perspective view of a left portion of a locking system for securing a fan cover disposed over the cabinet of FIG. 1A, according to certain aspects of the present disclosure.

FIG. 2B shows a front view of the left portion of the locking system of FIG. 2A, according to certain aspects of the present disclosure.

FIG. 2C shows a front perspective view of a right portion of a locking system for securing a fan cover disposed over the cabinet of FIG. 1A, according to certain aspects of the present disclosure.

FIG. 2D shows a front view of the right portion of the locking system of FIG. 2C, according to certain aspects of the present disclosure.

Figure 1A:
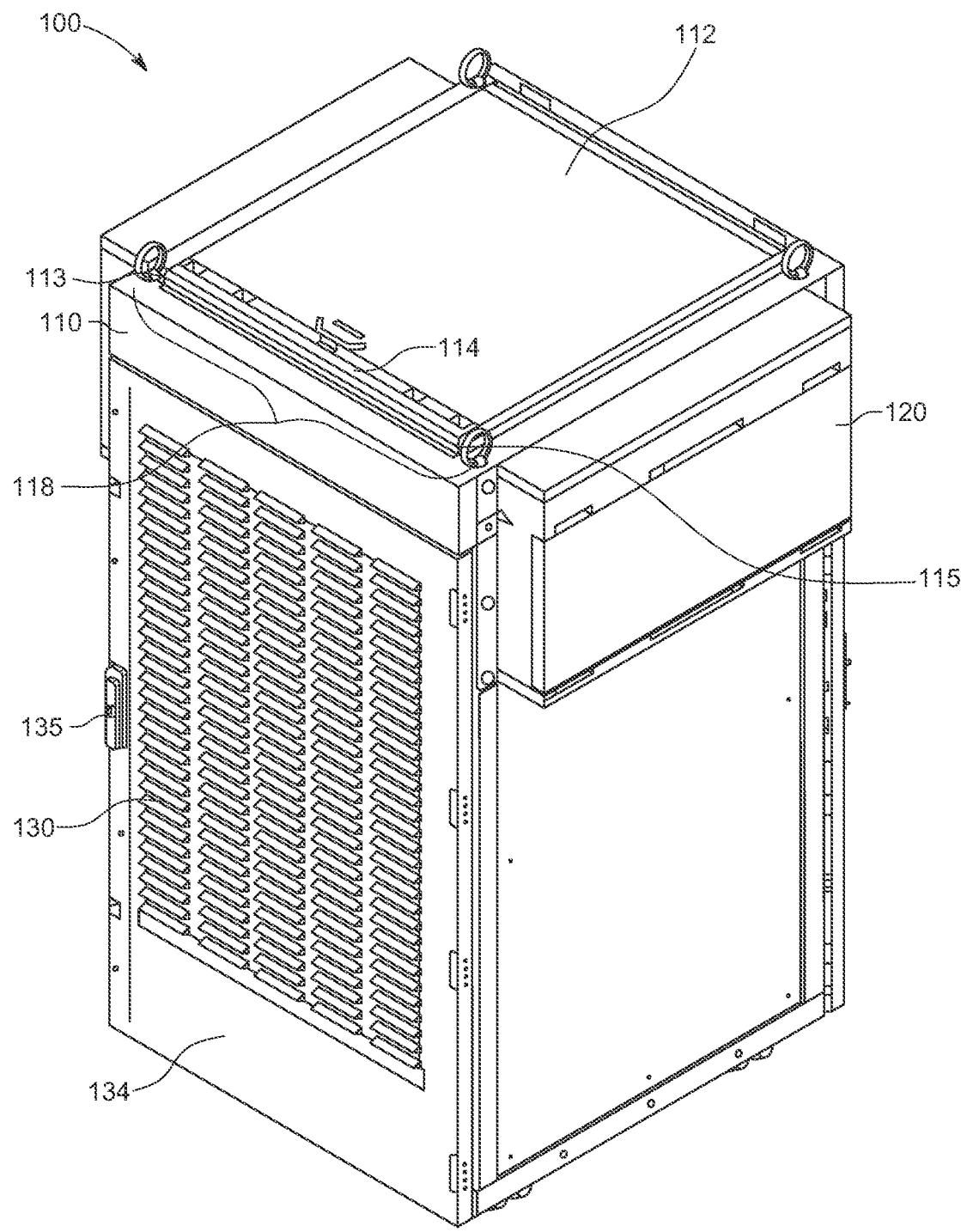
FIG. 1A shows a front perspective view of a cabinet for storing server equipment, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to a cabinet having a locking system for securing a fan cover disposed over the cabinet. The locking system includes at least one T-bar and a bracket. The T-bar has a horizontal bar movably disposed within a channel along a front edge of the fan cover, and a vertical bar extending generally perpendicularly to the horizontal bar from a first end of the vertical bar. The bracket is coupled to a hanging second end of the vertical bar and includes a knob that can be pulled downwards to unlock the horizontal bar at a first position that locks the fan cover and a second position that unlocks the fan cover, and move therebetween by pushing the bracket. The locking system is only accessible after opening a front door of the cabinet. The cabinet can be used for storing server equipment, wherein the fan cover can be used to secure a plurality of fan units for the server equipment.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
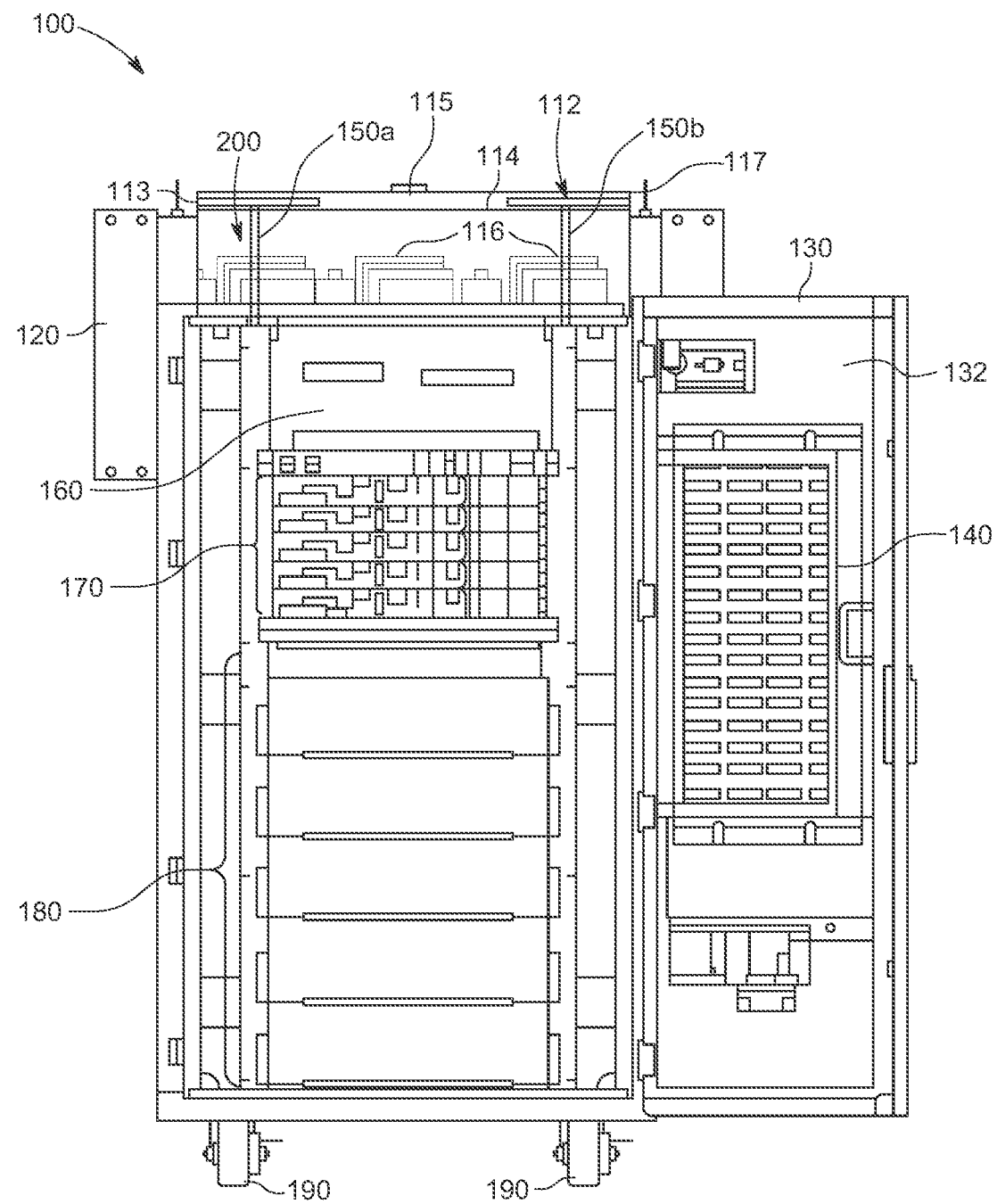
FIG. 1B shows a front view of the cabinet of FIG. 1A, according to certain aspects of the present disclosure.

Referring to the figures, FIG. 1A shows a front perspective view of a cabinet 100 for storing server equipment, while FIG. 1B shows a front view of the cabinet 100. The cabinet 100 includes a fan compartment 110 secured by a fan cover 112. The fan compartment 110 includes a plurality of fan units 116 for cooling the server equipment. The fan cover 112 has a channel 114 disposed along a front edge 118 of the fan cover 112. The channel 114 has a left edge 113, a right edge 117, and a central portion 115. The cabinet 100 has air ducts 120 on the left side and the right side adjacent to the fan compartment 110. The air ducts 120 act as outlets of airflow from the fan units 116 in the fan compartment 110.

The cabinet 100 is accessible by a front door 130 that has an inner surface 132 and an outer surface 134. The outer surface 134 includes a single key lock 135, which provides access to the contents of the cabinet 100, for example the plurality of servers 170. A plurality of air filters 140 is disposed along the inner surface 132. The cabinet 100 further includes a power system 160, a plurality of servers 170 disposed below the power system 160, and a plurality of battery units 180 disposed below the plurality of servers 170. The cabinet 100 is transportable via wheels 190.

The cabinet 100 includes a locking system 200 for securing the fan cover 112. The locking system 200 is accessible after opening the front door 130 of the cabinet 100. The locking system 200 includes a first T-bar 150a disposed on the left side of the central portion 115 and a second T-bar 150b disposed on the right side of the central portion 115. The locking system 200 is discussed in further detail with respect to FIGS. 2A-2D. In some embodiments, the locking system 200 may have only single T-bar disposed adjacent to the left edge 113 or the right edge 117, and movable towards the right edge 117 and the left edge 113, respectively. In other embodiments, the locking system 200 may have three or more T-bars disposed along different parts of the channel 114 between the left edge 113 and the right edge 117.

FIG. 2A shows a front perspective view of a left portion 200a of the locking system 200, while FIG. 2B shows a front view of the left portion 200a. The left portion 200a of the locking system 200 includes the first T-bar 150a and a first bracket 250a attached thereto. In the embodiment shown in FIGS. 2A-2B, the first T-bar 150a is configured to move between the left edge 113 (FIG. 1B) and the central portion 115 (FIG. 1B) of the channel 114 (FIG. 1B).

The first T-bar 150a includes a first horizontal bar 210a and a first vertical bar 220a that extends generally perpendicularly to the first horizontal bar 210a. The first horizontal bar 210a has a left end 212a and a right end 214a. The first horizontal bar 210a is movably disposed within the channel 114 (FIG. 1A) along the front edge 118 (FIG. 1A) of the fan cover 112 (FIG. 1A). The first vertical bar 220a has a first end 222a and a second end 224a. The first end 222a is coupled to the first horizontal bar 210a. The second end 224a extends vertically downwards and is coupled to the first bracket 250a.

A first block 230a and a second block 240a are disposed on the left side and the right side, respectively, of the first end 222a of the first vertical bar 220a. The first block 230a has a through-hole 235a and the second block 240a has a through-hole 245a. The through-holes 235a and 245a are configured to accommodate the first horizontal bar 210a through them. The first block 230a and the second block 240a are fixed to the channel 114 such that the first horizontal bar 210a can move horizontally through the through-holes 235a and 245a relative to the channel 114. While in the embodiment shown in FIGS. 2A-2B two blocks 230a, 240a are shown, in some embodiments, there may be only a single block disposed on the left side or the right side of the first end 222a. In yet other embodiments, there may be three or more blocks distributed evenly or unevenly on either side of the first end 222a.

The first bracket 250a is accessible after opening the front door 130 of the cabinet 100. The first bracket 250a includes a horizontal plate 260a coupled to the second end 224a of the first vertical bar 220a, and a vertical plate 270a that extends downwards generally perpendicular from the horizontal plate 260a. In the embodiment shown in FIGS. 2A-2B, the vertical plate 270a faces rightwards. However, in different embodiments, the vertical plate 270a may be aligned differently. A knob 280a is attached to the horizontal plate 260a adjacent to the second end 224a of the first vertical bar 220a. The knob 280a can be pulled downwards at each of the locking and unlocking positions of the first horizontal bar 210a, and then the first horizontal bar 210a is moved within the channel 114 by pushing the vertical plate 270a to lock and unlock the fan cover 112. While in the embodiment shown in FIGS. 2A-2B, there is only one bracket, in different embodiments, there may be different arrangements of multiple brackets (e.g., a horizontal bracket coupled to one or two vertical brackets) that provide the same functionality as the first bracket 250a to move the first horizontal bar 210a within the channel 114 by pushing the vertical plate 270a to lock and unlock the fan cover 112.

FIG. 2C shows a front perspective view of a right portion 200b of the locking system 200, while FIG. 2D shows a front view of the right portion 200b. The right portion 200b of the locking system 200 includes the second T-bar 150b and a second bracket 250b attached thereto. In the embodiment shown in FIGS. 2A-2B, the second T-bar 150b is configured to move between the right edge 117 (FIG. 1B) and the central portion 115 (FIG. 1B) of the channel 114 (FIG. 1B).

The second T-bar 150b includes a second horizontal bar 210b and a second vertical bar 220b that extends generally perpendicularly to the second horizontal bar 210*b*. The second horizontal bar 210*b* has a left end 212*b* and a right end 214*b*. The second horizontal bar 210*b* is movably disposed within the channel 114 (FIG. 1A) along the front edge 118 (FIG. 1A) of the fan cover 112 (FIG. 1A). The second vertical bar 220*b* has a first end 222*b* and a second end 224*b*. The first end 222*b* is coupled to the second horizontal bar 210*b*. The second end 224*b* extends vertically downwards and is coupled to the second bracket 250*b*.

A third block 230*b* and a fourth block 240*b* are disposed on the left side and the right side, respectively, of the first end 222*b* of the second vertical bar 220*b*. The third block 230*b* has a through-hole 235*b*, and the fourth block 240*b* has a through-hole 245*b*. The through-holes 235*b* and 245*b* are configured to accommodate the second horizontal bar 210*b* through them. The third block 230*b* and the fourth block 240*b* are fixed to the channel 114 such that the second horizontal bar 210*b* can move horizontally through the through-holes 235*b* and 245*b* relative to the channel 114. While in the embodiment shown in FIGS. 2C-2D two blocks 230*b*, 240*b* are shown, in some embodiments, there may be only a single block disposed on the left side or the right side of the first end 222*b*. In yet other embodiments, there may be three or more blocks distributed evenly or unevenly on either side of the first end 222*b*.

The second bracket 250*b* is accessible after opening the front door 130 of the cabinet 100. The second bracket 250*b* includes a horizontal plate 260*b* coupled to the second end 224*b* of the second vertical bar 220*b*, and a vertical plate 270*b* that extends downwards generally perpendicular from the horizontal plate 260*b*. In the embodiment shown in FIGS. 2A-2B, the vertical plate 270*b* faces leftwards. However, in different embodiments, the vertical plate 270*b* may be aligned differently. A knob 280*b* is attached to the horizontal plate 260*b* adjacent to the second end 224*b* of the second vertical bar 220*b*. The knob 280*b* can be pulled downwards at each of the locking and unlocking positions of the second horizontal bar 210*b*, and then the second horizontal bar 210*b* is moved within the channel 114 by pushing the vertical plate 270*b* to lock and unlock the fan cover 112. While in the embodiment shown in FIGS. 2C-2D, there is only one bracket, in different embodiments, there may be different arrangements of multiple brackets (e.g., a horizontal bracket coupled to one or two vertical brackets) that provide the same functionality as the second bracket 250*b* to move the second horizontal bar 210*b* within the channel 114 by pushing the vertical plate 270*b* to lock and unlock the fan cover 112.

Figure 3A:
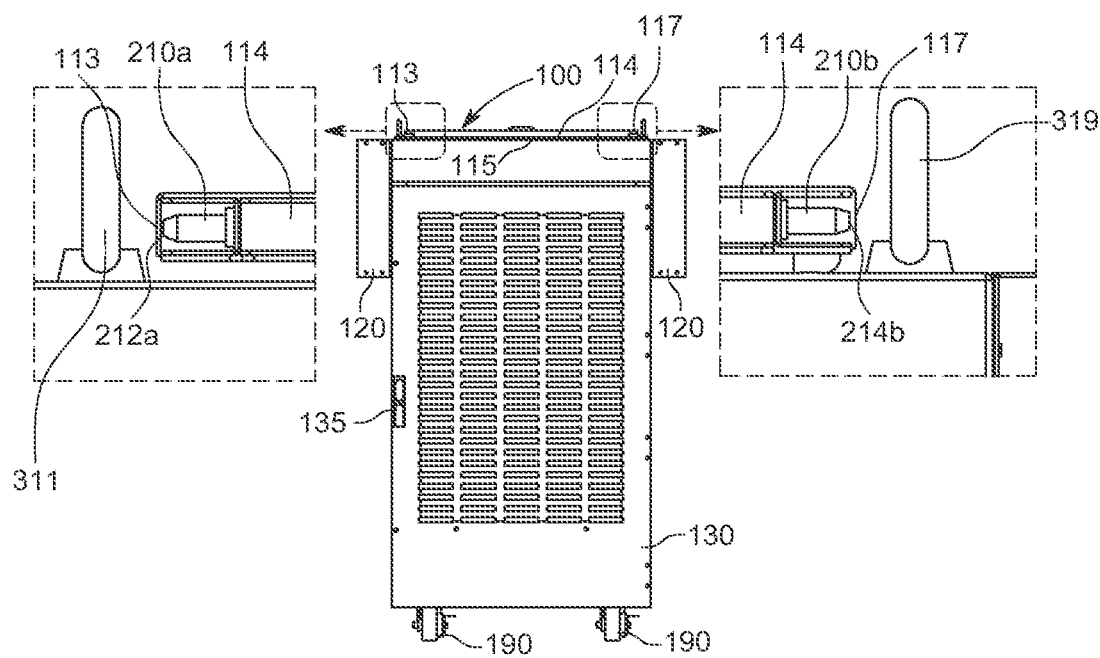
FIG. 3A shows a front view of the cabinet of FIG. 1A where the fan cover is in a locked position, according to certain aspects of the present disclosure.

FIG. 3A shows a front view of the cabinet 100 where the fan cover 112 is in a locked position. Initially, the front door 130 of the cabinet 100 is closed. As shown in the left inset of FIG. 3A, the first horizontal bar 210*a* of the locking system 200 (FIG. 2B) is disposed adjacent to the left edge 113 of the channel 114 on the left side of the central portion 115. As shown in the right inset of FIG. 3A, the second horizontal bar 210*b* of the locking system 200 is disposed adjacent to the right edge 117 of the channel 114 on the right side of the central portion 115. The left end 212*a* of the first horizontal bar 210*a* is positioned against the left edge 113 near the left ring 311 on the fan compartment 110 (FIG. 1A). The right end 214*b* of the second horizontal bar 210*b* is positioned against the right edge 117 near the right ring 319 on the fan compartment 110.

Figure 3B:
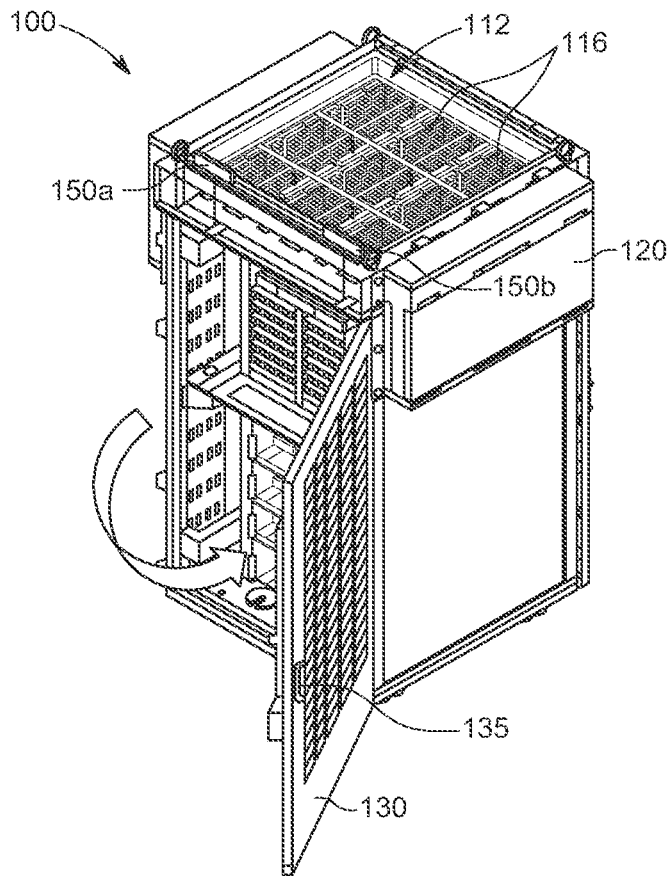
FIG. 3B shows a front perspective view of a step of opening a front door of the cabinet of FIG. 1A, according to certain aspects of the present disclosure.

FIG. 3B shows a front perspective view of a step of opening the front door 130 by using the single key lock 135 thereon. This provides access to the first T-bar 150*a* and the second T-bar 150*b* of the locking system 200 (FIG. 2B), securing the fan cover 112 over the plurality of fan units 116.

Figure 4A:
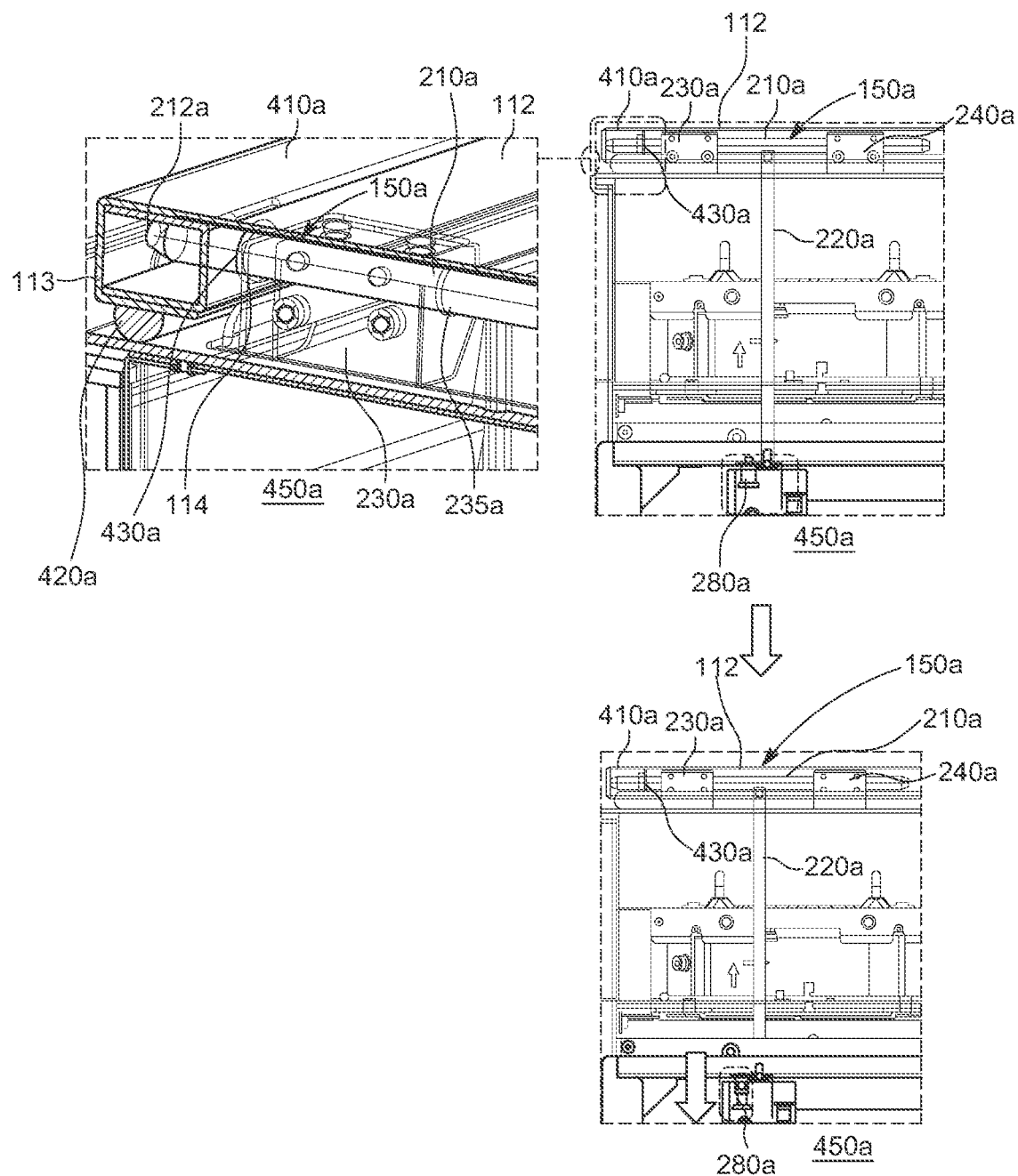
FIG. 4A shows a front view (with an additional inset of front perspective view) of accessing and pulling a knob on the left portion of the locking system of FIG. 2A from a locked position on the cabinet of FIG. 1A, according to certain aspects of the present disclosure.

FIG. 4A shows a front view (with an additional inset of front perspective view) of accessing and pulling the knob 280*a* on the left portion 200*a* of the locking system 200 (FIG. 1B) from a locked position 450*a* of the fan cover 112. The fan cover 112 has a first hollow beam 410*a* on the left side that intersects with the channel 114 through a first aperture 430*a*. The first hollow beam 410*a* is supported on a first padding 420*a*. In the locked position 450*a*, the first horizontal bar 210*a* of the first T-bar 150*a* passes through the through-hole 235*a* in the first block 230*a*, the through-hole 245*a* in the second block 240*a*, and the first aperture 430*a* into the first hollow beam 410*a* such that the left end 212*a* is positioned against the left edge 113 of the channel 114. When the left portion 200*a* of the locking system 200 is accessed after opening the front door 130, the knob 280*a* is released from its secured position and pulled downwards.

Figure 4B:
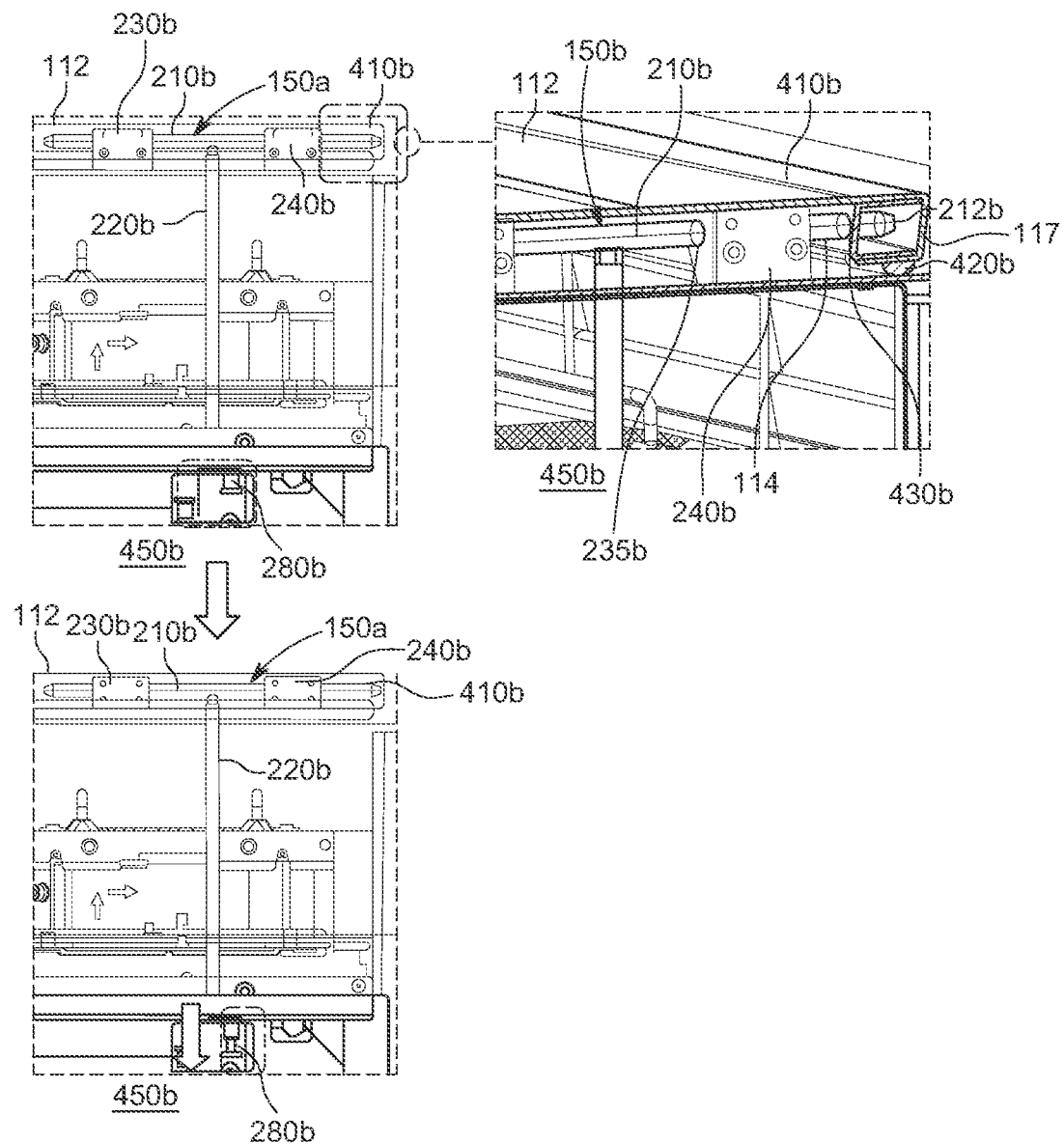
FIG. 4B shows a front view (with an additional inset of front perspective view) of accessing and pulling a knob on the right portion of the locking system of FIG. 2C from a locked position on the cabinet of FIG. 1A, according to certain aspects of the present disclosure.

FIG. 4B shows a front view (with an additional inset of front perspective view) of accessing and pulling a knob on the right portion 200*b* of the locking system 200 (FIG. 1B) from a locked position 450*b* of the fan cover 112. The fan cover 112 has a second hollow beam 410*b* on the right side that intersects with the channel 114 through a second aperture 430*b*. The second hollow beam 410*b* is supported on a second padding 420*b*. In the locked position 450*b*, the second horizontal bar 210*b* of the second T-bar 150*b* passes through the through-hole 235*b* in the third block 230*b*, the through-hole 245*b* in the fourth block 240*b*, and the second aperture 430*b* into the second hollow beam 410*b* such that the right end 214*b* is positioned against the right edge 117 of the channel 114. When the right portion 200*b* of the locking system 200 is accessed after opening the front door 130, the knob 280*b* is released from its secured position and pulled downwards.

Thus the first position 450*a*, 450*b* that locks the fan cover 112 is formed by the first T-bar 150*a* positioned at the left edge 113 of the channel 114 and the second T-bar 150*b* positioned at the right edge 117 of the channel 114.

Figure 5A:
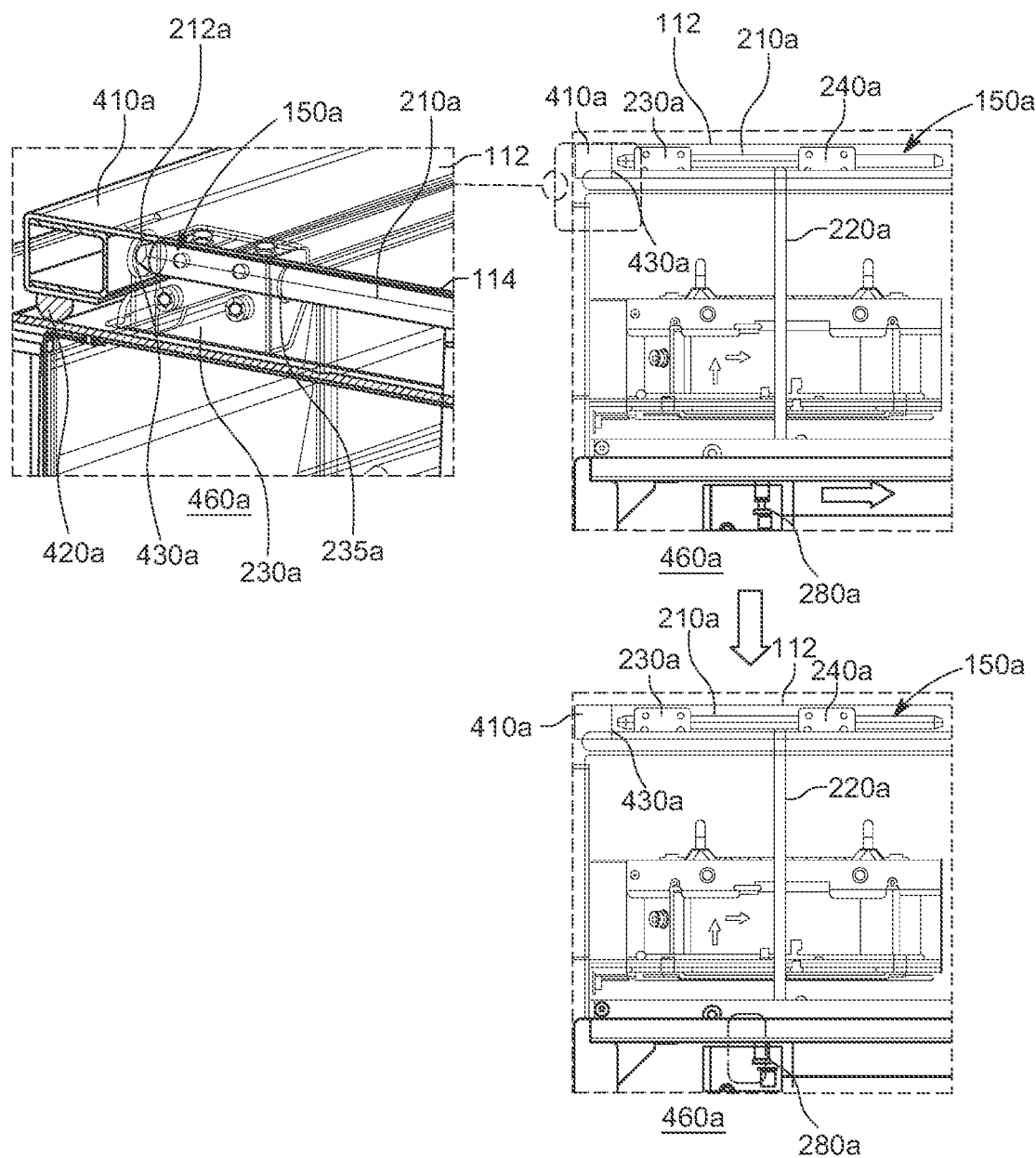
FIG. 5A shows a front view (with an additional inset of front perspective view) of pushing a bracket attached to the knob on the left portion of the locking system of FIG. 2A to unlock the fan cover on the cabinet of FIG. 1A, according to certain aspects of the present disclosure.

FIG. 5A shows a front view (with an additional inset of front perspective view) of pushing the vertical plate 270*a* attached to the knob 280*a* on the left portion 200*a* of the locking system 200 (FIG. 1B) to an unlocked position 460*a* of the fan cover 112. The vertical plate 270*a* is pushed sideways towards the central portion 115 (FIG. 1B) of the channel 114 until it reaches the unlocked position 460*a*. Accordingly, the first horizontal bar 210*a* of the first T-bar 150*a* moves rightward through the first aperture 430*a*, the through-hole 235*a* in the first block 230*a*, and the through-hole 245*a* in the second block 240*a* until the left end 212*a* moves to the right of the first aperture 430*a* and the right end 214*a* is adjacent to the central portion 115 of the channel 114. Thus, in the unlocked position 460*a*, the first horizontal bar 210*a* only passes through the through-hole 235*a* in the first block 230*a* and the through-hole 245*a* in the second block 240*a*. Once the first horizontal bar 210*a* reaches the unlocked position 460*a*, the knob 280*a* can be pressed into a secured position that prevents it from sliding away.

Figure 5B:
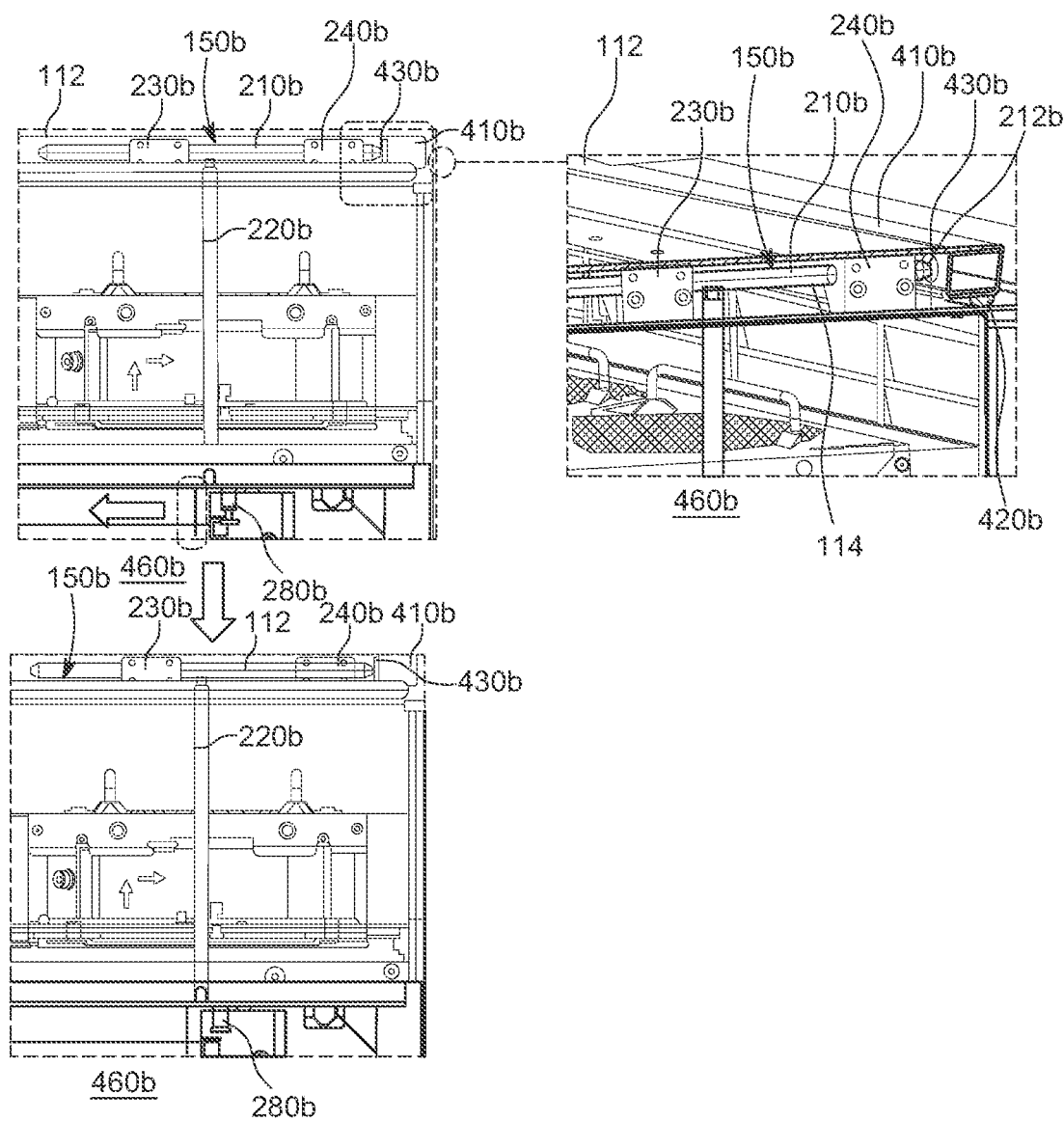
FIG. 5B shows a front view (with an additional inset of front perspective view) of pushing a bracket attached to the knob on the right portion of the locking system of FIG. 2C to unlock the fan cover on the cabinet of FIG. 1A, according to certain aspects of the present disclosure.

FIG. 5B shows a front view (with an additional inset of front perspective view) of pushing the vertical plate 270*b* attached to the knob 280*b* on the right portion 200*b* of the locking system 200 (FIG. 1B) to an unlocked position 460*b* of the fan cover 112. The vertical plate 270*b* is pushed sideways towards the central portion 115 (FIG. 1B) of the channel 114 until it reaches the unlocked position 460*b*. Accordingly, the second horizontal bar 210*b* of the second T-bar 150*b* moves leftward through the second aperture 430b, the through-hole 235b in the third block 230b, and the through-hole 245b in the fourth block 240b until the right end 214b moves to the left of the second aperture 430b and the left end 212b is adjacent to the central portion 115 of the channel 114. Thus, in the unlocked position 460b, the second horizontal bar 210b only passes through the through-hole 235b in the third block 230b and the through-hole 245b in the fourth block 240b. Once the second horizontal bar 210b reaches the unlocked position 460b, the knob 280b can be pressed into a secured position that prevents it from sliding away.

Thus, the second position 460a, 460b that unlocks the fan cover 112 is formed by both the first T-bar 150a and the second T-bar 150b positioned at the central portion 115 of the channel 114.

Figure 6:
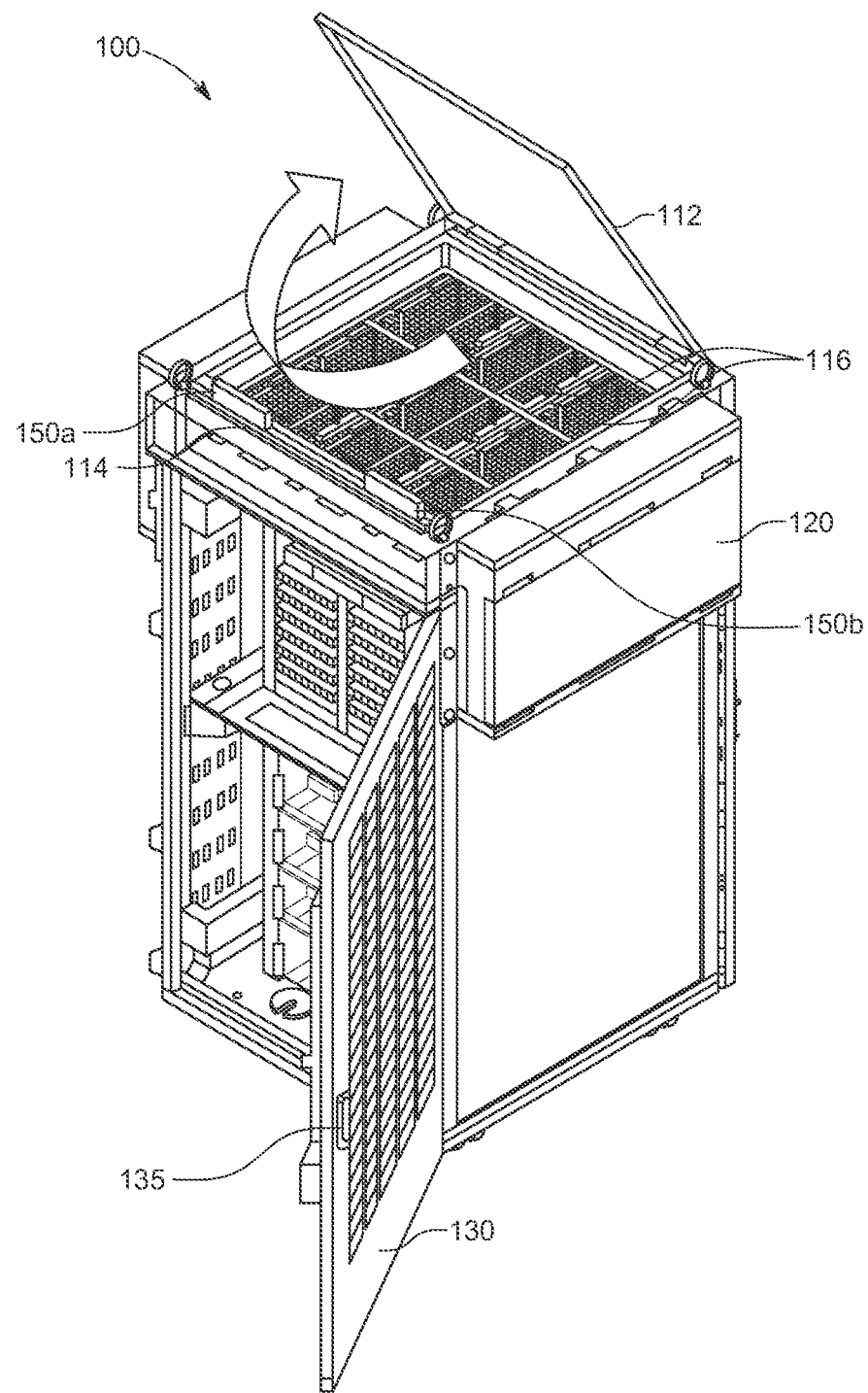
FIG. 6 shows a front perspective view of opening the fan cover on the cabinet of FIG. 1A, according to certain aspects of the present disclosure.

FIG. 6 shows a front perspective view of opening the fan cover 112 on the cabinet 100. Once the first T-bar 150a has moved from the locked position 450a (FIG. 4A) to the unlocked position 460a (FIG. 5A) and the second T-bar 150b has moved from the locked position 450b (FIG. 4A) to the unlocked position 460b (FIG. 5A), the fan cover 112 can be lifted up to open and access the plurality of fan units 116.

While closing the fan cover 112, the reverse course of actions shown in FIGS. 3-6 would be undertaken. The fan over 112 would be placed over the fan compartment 110 (FIGS. 1A-1B and FIG. 6). Then the knobs 280a, 280b (FIGS. 5A-5B) would be released from the unlocked positions 460a, 460b (FIGS. 5A-5B) and pulled downwards. Subsequently, the vertical plates 270a, 270b would be pushed to the left and the right, respectively, to move the T-bars 150a, 150b (FIGS. 4A-4B) from the unlocked positions 460a, 460b to the locked positions 450a, 450b (FIGS. 4A-4B) respectively. This corresponds to the movement of the horizontal bars 210a, 210b from the central portion 115 of the channel 114 on the fan cover 112 to the left edge 113 and the right edge 117, respectively. Once the horizontal bars 210a, 210b of the respective T-bars 150a, 150b are pushed to the respective locked positions 450a, 450b, the knobs 280a, 280b can be pressed into secured positions. At this point, the front door 130 (FIGS. 1A-1B.) of the cabinet 100 can be closed by using the single key lock 135 (FIGS. 3A-3B).

Figure 7:
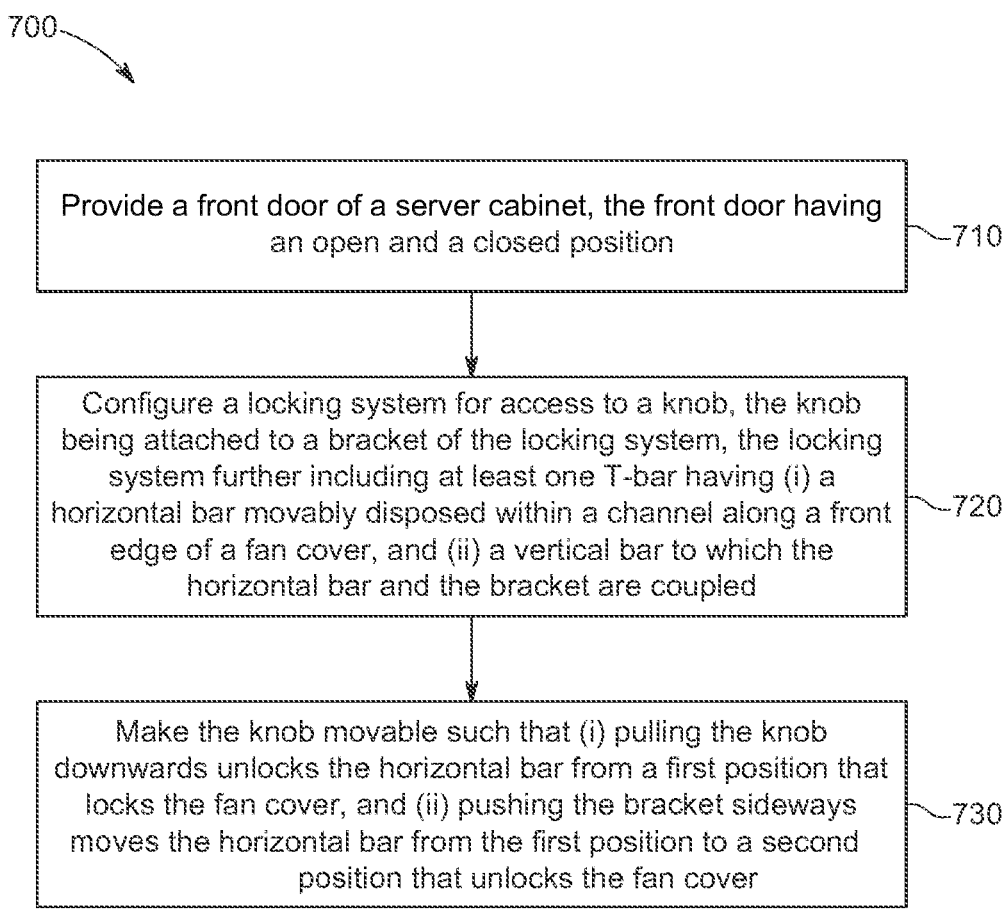
FIG. 7 shows a block diagram of a method of providing a locking system on the cabinet of FIG. 1A using the locking system of FIG. 2A and FIG. 2C, according to certain aspects of the present disclosure.

FIG. 7 shows a block diagram of a method 700 for securing a fan cover disposed over a server cabinet using the locking system 200. The locking system 200 has the left portion 200a (FIG. 2A) and the right portion 200b (FIG. 2C). The method 700 starts in block 710, where a front door is provided on a server cabinet, wherein the front door has an open and a closed position. In some embodiments, the cabinet may store information-handling systems or electronic systems other than server equipment.

In block 720, a locking system of the cabinet is configured for access to a knob, where the knob is attached to a bracket of the locking system. The locking system may further include at least one T-bar having a horizontal bar movably disposed within a channel along a front edge of the fan cover, and a vertical bar to which the horizontal bar and the bracket are coupled. In some embodiments, there may be two T-bars—a first T-bar and a second T-bar disposed towards a left side and a right side of the cabinet. In such embodiments, the first T-bar is configured to move between a left edge of the channel and a central portion of the channel by pushing a corresponding bracket attached to the knob on the first T-bar. Similarly, the second T-bar is configured to move between a right edge of the channel and the central portion of the channel by pushing a corresponding bracket attached to the knob on the second T-bar.

In block 730, the knob on the at least one T-bar is made movable such that (i) pulling the knob downwards unlocks the horizontal bar from a first position that locks the fan cover, and (ii) pushing the bracket sideways moves the horizontal bar from the first position to a second position that unlocks the fan cover. In some embodiments of the locking system having the first T-bar and the second T-bar described above, the vertical plate 270a on the first T-bar is pushed towards the right such that the first T-bar moves from the left edge of the channel to the central portion of the channel. Similarly, the vertical plate 270b on the second T-bar is pushed towards the left such that the second T-bar moves from the right edge of the channel to the central portion of the channel. In some such embodiments, the first position that locks the fan cover is formed by the first T-bar positioned at the left edge of the channel and the second T-bar positioned at the right edge of the channel. Similarly, the second position that unlocks the fan cover is formed by both the first T-bar and the second T-bar positioned at the central portion of the channel. This step is illustrated and described in detail above with respect to FIGS. 5A-5B.

The method 700 may further include the steps of configuring the knob to be secured when the horizontal bar is at the second position.

Embodiments of the cabinets described herein can be advantageously used to lock and unlock a fan cover securing fan units with the locking systems configured therein. The locking systems have a simple design and involve the use of a single key lock to access both the servers and the fan units secured by the fan cover, rather than having separate key locks for both the cabinet and the fan cover disposed over the cabinet.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cabinet for storing server equipment, the cabinet comprising:
    a fan cover disposed over the cabinet and configured to secure a plurality of fan units, the fan cover having a channel disposed along a front edge of the fan cover; and
    a locking system for securing the fan cover, the locking system comprising:
        at least one T-bar comprising:
            a horizontal bar movably disposed within the channel; and
            a vertical bar extending generally perpendicularly to the horizontal bar from a first end of the vertical bar, the vertical bar being positioned between opposite ends of the horizontal bar to form a T-shape of the T-bar; and
a bracket coupled to a second end of the vertical bar, the bracket having a knob attached thereto for locking and unlocking the horizontal bar at a first position that locks the fan cover and a second position that unlocks the fan cover, the first position being at a first distance between left and right edges of the channel, the second position being at a second distance between left and right edges of the channel;
wherein the at least one T-bar further includes at least one block fixed to the channel, the block having a through-hole for accommodating the horizontal bar therethrough.

2. The cabinet of claim 1, wherein the at least one T-bar further includes two blocks, each block disposed on either side of the first end of the vertical bar.

3. The cabinet of claim 1, wherein the bracket includes (i) a horizontal plate coupled to the knob and the second end of the vertical bar, and (ii) a vertical plate extending generally perpendicular to the horizontal plate for moving the horizontal bar between the first position and the second position.

4. The cabinet of claim 1, further comprising a front door having a key lock that provides access to the server equipment.

5. The cabinet of claim 4, wherein the bracket is accessible after opening the front door.

6. The cabinet of claim 1, wherein the knob is configured to be pulled downwards for unlocking the horizontal bar at each of the first position and the second position.

7. The cabinet of claim 1, wherein the locking system further comprises:
a first T-bar configured to move between the left edge of the channel and a central portion of the channel; and
a second T-bar configured to move between the right edge of the channel and the central portion of the channel.

8. The cabinet of claim 7, wherein:
the first position that locks the fan cover is formed by the first T-bar positioned at the left edge of the channel and the second T-bar positioned at the right edge of the channel; and
the second position that unlocks the fan cover is formed by both the first T-bar and the second T-bar positioned at the central portion of the channel.

9. A cabinet for storing server equipment, the cabinet comprising:
a fan cover disposed over the cabinet and configured to secure a plurality of fan units, the fan cover having a channel disposed along a front edge of the fan cover; and
a locking system for securing the fan cover, the locking system comprising at least one T-bar including:
a horizontal bar movably disposed within the channel; and
a vertical bar extending generally perpendicularly to the horizontal bar from a first end of the vertical bar; and
two blocks fixed to the channel, each block disposed on either side of the first end of the vertical bar and having a through-hole for accommodating the horizontal bar therethrough.

10. The cabinet of claim 9, wherein the locking system further comprises a bracket coupled to a second end of the vertical bar, the bracket having a knob attached thereto for locking and unlocking the horizontal bar at a first position that locks the fan cover and a second position that unlocks the fan cover.

11. The cabinet of claim 10, further comprising a front door having a key lock that provides access to the server equipment.

12. The cabinet of claim 11, wherein the bracket is accessible after opening the front door.

13. The cabinet of claim 10, wherein the bracket includes (i) a horizontal plate coupled to the knob and the second end of the vertical bar, and (ii) a vertical plate extending generally perpendicular to the horizontal plate for moving the horizontal bar between the first position and the second position.

14. The cabinet of claim 10, wherein the locking system further comprises:
a first T-bar configured to move between a left edge of the channel and a central portion of the channel; and
a second T-bar configured to move between a right edge of the channel and the central portion of the channel.

15. The cabinet of claim 14, wherein:
the first position that locks the fan cover is formed by the first T-bar positioned at the left edge of the channel and the second T-bar positioned at the right edge of the channel; and
the second position that unlocks the fan cover is formed by both the first T-bar and the second T-bar positioned at the central portion of the channel.

16. A method for securing a fan cover disposed over a server cabinet, the method comprising:
providing a front door of a server cabinet, the front door having an open and a closed position;
configuring a locking system for access to a knob, the knob being attached to a bracket of the locking system, the locking system further including at least one T-bar having (i) a horizontal bar movably disposed within a channel along a front edge of a fan cover, and (ii) a vertical bar to which the horizontal bar and the bracket are coupled, the vertical bar being positioned between opposite ends of the horizontal bar to form a T-shape of the T-bar; and
making the knob movable such that (i) pulling the knob downwards unlocks the horizontal bar from a first position that locks the fan cover, and (ii) pushing the bracket sideways moves the horizontal bar from the first position to a second position that unlocks the fan cover, the first position being at a first distance between left and right edges of the channel, the second position being at a second distance between left and right edges of the channel;
wherein the at least one T-bar further includes at least one block fixed to the channel, the block having a through-hole for accommodating the horizontal bar therethrough.

17. The method of claim 16, further comprising configuring the knob to be secured when the horizontal bar is at the second position.

18. The method of claim 16, further comprising:
configuring a first T-bar to move between a left edge of the channel and a central portion of the channel such that a corresponding bracket on the first T-bar is pushed rightward; and
configuring a second T-bar to move between a right edge of the channel and the central portion of the channel such that a corresponding bracket on the second T-bar is pushed leftward.

19. The method of claim 18, further comprising:
forming the first position that locks the fan cover via the first T-bar being positioned at the left edge of the channel and the second T-bar being positioned at the right edge of the channel; and
forming the second position that unlocks the fan cover via both the first T-bar and the second T-bar being positioned at the central portion of the channel.

20. A cabinet for storing server equipment, the cabinet comprising:
a fan cover disposed over the cabinet and configured to secure a plurality of fan units, the fan cover having a channel disposed along a front edge of the fan cover; and
a locking system for securing the fan cover, the locking system comprising:
at least one T-bar comprising:
a horizontal bar movably disposed within the channel; and
a vertical bar extending generally perpendicularly to the horizontal bar from a first end of the vertical bar; and
a bracket coupled to a second end of the vertical bar, the bracket having a knob attached thereto for locking and unlocking the horizontal bar at a first position that locks the fan cover and a second position that unlocks the fan cover;
wherein the at least one T-bar further includes at least one block fixed to the channel, the block having a through-hole for accommodating the horizontal bar therethrough.

* * * * *